United States Patent [19]

Hino

[11] Patent Number: 4,620,153

[45] Date of Patent: Oct. 28, 1986

[54] MAGNETIC RESONANCE IMAGING SYSTEM

[75] Inventor: Masaaki Hino, Ootawara, Japan

[73] Assignee: Kabushiki Kaisha Toshiba, Tokyo, Japan

[21] Appl. No.: 661,459

[22] Filed: Oct. 16, 1984

[30] Foreign Application Priority Data

Oct. 17, 1983 [JP] Japan ................... 58-193750

[51] Int. Cl.⁴ ........................................... G01R 33/20
[52] U.S. Cl. .................................... 324/309; 324/307; 324/312; 364/414
[58] Field of Search .............. 324/307, 309, 312; 364/414; 378/901; 128/653

[56] References Cited

U.S. PATENT DOCUMENTS

| | | | |
|---|---|---|---|
| 4,135,247 | 1/1979 | Gordon et al. | 364/414 |
| 4,168,435 | 9/1979 | Duinker | 364/414 X |
| 4,340,862 | 7/1982 | Percival et al. | 324/309 |
| 4,446,521 | 5/1984 | Inouye | 364/414 |
| 4,486,708 | 12/1984 | Macovski | 324/309 |
| 4,551,680 | 11/1985 | Macovski | 324/309 |
| 4,555,760 | 11/1985 | Op de Beek | 364/414 |

FOREIGN PATENT DOCUMENTS

1471531  4/1977  United Kingdom .

Primary Examiner—Stephen A. Kreitman
Assistant Examiner—Scott M. Oldham
Attorney, Agent, or Firm—Finnegan, Henderson, Farabow, Garrett & Dunner

[57] ABSTRACT

In an MRI system of the present invention, data of a reconstruction starting point, a sampling interval of projection data for respective lines along a specific line direction in a reconstruction image matrix and a predetermined correction coefficient value of the projection data are transferred to a constant generating circuit. In response to these data, the data of the sampling interval and the correction coefficient value for the specific line direction by every projection are generated, and the reconstruction starting points of the respective lines are sequentially generated. An output from the constant generating circuit is supplied to a reconstructor. In the reconstructor, the sampling interval is added to the reconstruction starting point, thereby obtaining reconstruction sampling positions of the projection data for the line direction corresponding to the reconstruction starting point. Then, the projection data corresponding to the respective sampling positions are back-projected onto a coordinate matrix, thereby performing fast back projection for the corresponding lines. Image data which is back-projected by the reconstructor is cumulatively held in an image memory.

7 Claims, 5 Drawing Figures

MAGNETIC RESONANCE IMAGING SYSTEM

BACKGROUND OF THE INVENTION

The present invention relates to a magnetic resonance imaging (MRI) system in which a measuring technique utilizing the magnetic resonance (MR) phenomenon is adopted in a computed tomography (CT) technique and, more particularly, to a fast reconstruction technique for obtaining a reconstructed image in a short time in a system in which a back projection method is adopted in image reconstruction.

In such an MRI system, the MR phenomenon occurs in an object to be examined, and a magnetic wave which is excited by the MR phenomenon is detected as an MR signal. In accordance with this MR signal, projection data in which resonance data of specific nucleus is projected on a specific slice of the object to be examined can be obtained in many directions. These projection data are subjected to image reconstruction processing, and image data representing at least one of a spin density of the specific nucleus and a relaxation time constant can be obtained. In this manner, a technique for obtaining the image data representing at least one of the spin density and the relaxation time constant is called magnetic resonance imaging (MRI). Since the MRI system can be effectively used for medical diagnosis, it is beginning to be used for medical use.

In this MRI system when the back projection method is adoped in image reconstruction, convolution calculation, back projection image reconstruction calculation and the like are needed. These processings become a large load to a host central processing unit (CPU), and time necessary for finally obtaining the reconstructed image cannot be ignored. A fast reconstructing unit (FRU) which is used in an X-ray computed tomographic system (referred to as XCT system hereafter) cannot be used in the MRI system because of a difference between projection principles of the XCT system and the MRI system. Thus, development of the FRU for the MRI system has been recently demanded. Furthermore, in order to popularize the MRI system, cost for realizing the FRU must be minimized.

SUMMARY OF THE INVENTION

It is an object of the present invention to provide a low-cost MRI system in which time taken for image reconstruction is shortened, efficiency for image formation can be improved and a simple structure can be provided.

According to the present invention, there is provided an MRI system, comprising a means for performing image reconstruction processing which comprises:

a central processing unit for generating data of a reconstruction starting point of projection data about a first line parallel to a second direction in a reconstruction image matrix in which coordinate axes consist of a first direction corresponding to a direction parallel to a projection angle reference direction and the second direction perpendicular to the first direction, and data of a sampling interval and data of a predetermined correction coefficient value of the projection data along the first and second directions for every projection;

a constant data generating circuit for sequentially generating respective data of the sampling interval for the second direction and the correction coefficient value for every projection and for generating the reconstruction starting point data of respective lines aligned along the first direction and parallel to the second direction in correspondence to the reconstruction starting point of the first line parallel to the second direction, and the sampling intervals for the first and second directions and the correction coefficient value provided from the central processing unit;

a reconstructor in which reconstruction sampling positions of the projection data along a line direction parallel to the second direction corresponding to the reconstruction starting points are obtained by simply adding the sampling intervals to the respective reconstruction starting points in correspondence with the data of the sampling interval for the second direction and the correction coefficient values and reconstruction starting points of the respective lines parallel to the second direction in the reconstruction image matrix which are supplied from the constant generating circuit, thereby performing back projection on the reconstruction image matrix about the sampling positions;

an image memory for accumulating and holding image data back-projected by the reconstructor; and a timing controlling unit for generating a control signal to the constant generating circuit, the reconstructor and the image memory for determining an operation timing.

In an MRI system having such a construction, not only the image memory, but also the reconstructor for performing fast back projection can have a construction common with that of an XCT system. For this reason, in this MRI system, time necessary for image reconstruction can be shortened and efficiency of image formation can be improved. In addition to these advantages, simple construction and low cost can be realized.

DETAILED DESCRIPTION OF THE PREFERRED EMBODIMENT

A principle of the present invention will first be described.

Back projection processing is to obtain an image f (x, y) in an original space by projection data q (S, $\theta$) after filter correction. When the projection data is obtained by projecting a parallal beam, the back projection processing can be expressed as follows:

$$f(x, y) = C \int_0^\pi q(S, \theta) d\theta, \qquad (1)$$

where $S = x \cos \theta + y \sin \theta$, and C is constant.

This equation (1) is for a continuous system, but the following equation for a discrete system can be obtained in substantially the same manner:

$$f(x, y) = C \sum_{k=0}^{\pi} q(S, \theta k)\Delta\theta. \qquad (2)$$

Figure 1:
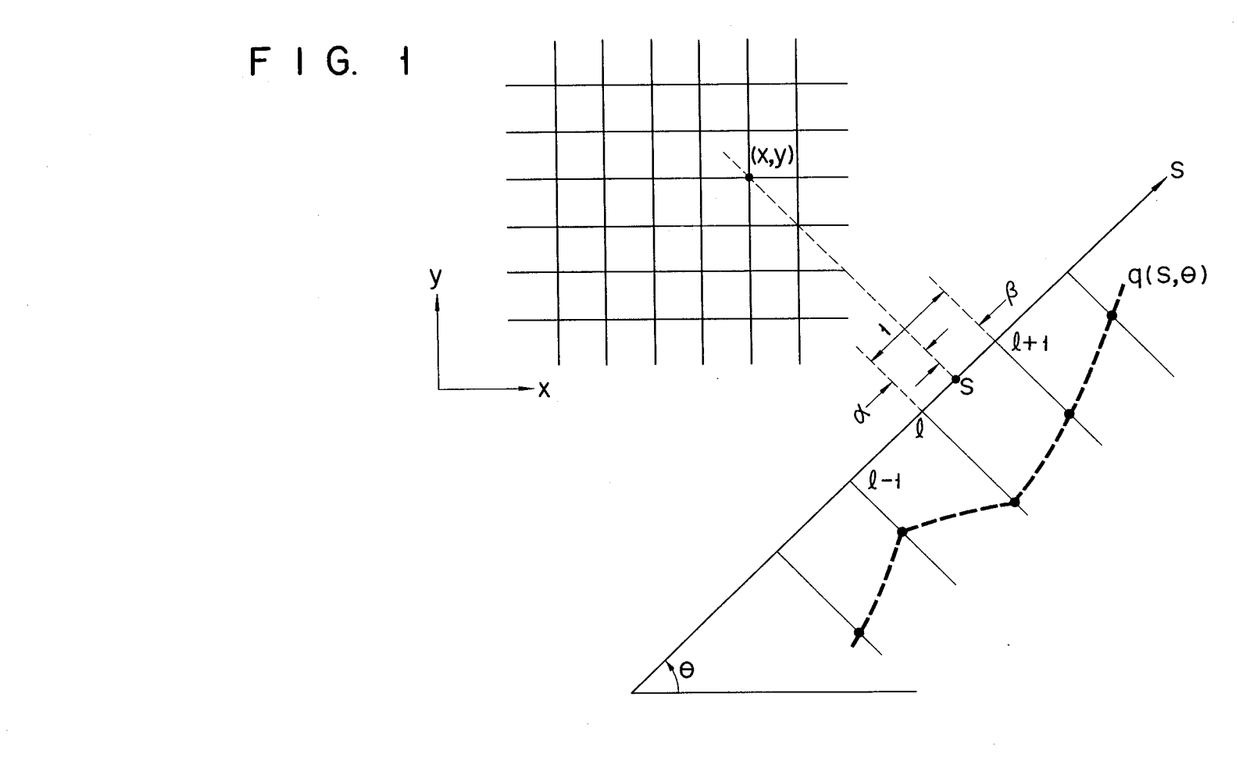
FIG. 1 is a view for explaining a principle of image reconstruction according to a back projection method.

In the actual sampled projection data, data of a point corresponding to a point (x, y) to be obtained does not exist in most cases. Then, data of the point (x, y) is obtained by interpolating using the following equation corresponding to the principle view shown in FIG. 1:

$$q(S, \theta) = \alpha q(l + 1, \theta) + \beta q(l, \theta) \qquad (3)$$
$$= \alpha \Delta qe + q(l, \theta),$$

where $\alpha = S - l$, $\beta = 1 - \alpha$, and $\Delta qe = q(l+1, \theta) - q(l, \theta)$.

Since projection in MR imaging can be regarded as projection by the parallel beam in principle, this principle can be adopted. On the other hand, many XCT systems use a fan-beam X-ray. In such a case, an image is generally reconstructed in accordance with the same principle as described above after converting the data by the fan beam into data corresponding to the data by the parallel beam. In the XCT systems, since the various correction operations (e.g., correction with respect to changes in X-ray dose over time in an X-ray tube) are added to the data from an X-ray detector, an FRU for the XCT system cannot be directly used for the MRI system. However, in processing after converting data into the data by the parallel beam, in the XCT and MRI systems, an image is obtained by basically the same principle. For this reason, a portion for performing this common processing can be constructed to be compatible.

The present invention has been made in consideration of this. According to the present invention, the reconstructor and image memory in the FRU of the XCT system can also be used in the MRI system with substantially no modification. For this reason, in the present invention, the FRU of the MRI system can be realized without requiring a complex construction, and at the same time, low cost can be achieved.

Even if differences in bit precision and an image matrix are found between the XCT and MRI systems, the principle of the present invention is not directly affected by these differences, and specific care not need be taken with respect to these differences.

In the reconstructor of the FRU in the XCT system, back projection as expressed by the following equation is made in the original space in correspondence to a reconstruction starting point Sna with respect to a line direction (e.g., the X-direction of the image matrix) of the projection data and a sampling interval along the line direction:

$$DPBR_{(x, y)} = [\{DCEN_{k(x, y)+1} - DCEN_{k(x, y)}\} \, 1(x, y) + DCEN_{k(x, y)}]\omega a \qquad (4),$$

where $DPBR_{(x, y)}$ is back projection data with respect to the point (x, y) in the original space, $DCEN_{(x, y)}$ is the projection data which is subjected to various processes determined by Sna and $\Delta$Xa and is further converted into the data of the parallel beam, $\omega a$ is a correction coefficient value of the projection data, 1 is a interpolation constant determined by Sna and $\Delta$Xa which is corresponding to $\alpha$ in equation (3)), and k is an address of a projection data memory determined by Sna and $\Delta$Xa.

In the reconstructor, a memory for storing the projection data for calculating in accordance with equation (4) is provided. An address of the memory is selected by k and k+1. 1 and k are determined by Sna (n: line number, a: projection number) and $\Delta$Xa (a: projection number). In other words, the respective reconstruction sampling point (position) k can be obtained in the following equation by the reconstruction starting point Sna and the sampling interval $\Delta$Xa. Note that k corresponds to an integral part when the sampling interval of the projection data is normalized as "1", and 1 corresponds to a decimal part thereof. For example, it is assumed that Sk is 16-bit data and upper 10 bits thereof are the integral part, 1 corresponds to lower 6 bits and k corresponds to upper 10 bits.

$$S1 = Sna + \Delta Xa, \qquad (5)$$

$$S2 = S1 + \Delta Xa, \text{ and}$$

$$\cdot \quad \cdot \quad \cdot$$
$$\cdot \quad \cdot \quad \cdot$$
$$\cdot \quad \cdot \quad \cdot$$

$$Sk = S(k - 1) + \Delta Xa$$

As described above, this represents that when Sna, $\Delta$Xa and $\omega$a are given to the reconstructor, reconstruction of an nth line is performed. Sn;1a, $\Delta$Xa and $\omega$a are given for processing the next line. In this manner, the same operations are repeated for a number of times corresponding to the number of the lines of one image, thereby achieving image reconstruction of one projection.

In the MRI system, the projection data is regarded as data by the parallel beam as described above, and the principle will be described with reference to FIG. 2.

A reconstruction starting point S0a of the 0th line as a reference of reconstruction calculation is obtained by the following equations:

$$S0a = [\{(M-1)/2\}\Delta Ya] - [\{(M-1)/2\}\Delta Xa] + C \qquad (6),$$

$$\Delta Xa = \Delta x \cdot N \cdot ts \cdot G \cdot \cos \theta a \times 10^{-7} \qquad (7),$$

and $$\Delta Ya = \Delta y \cdot N \cdot ts \cdot G \cdot \cos \theta a \times 10^{-7} \qquad (8),$$

where S0a is the reconstruction starting point of the 0th line of ath projection, M is a matrix size, $\Delta$x and $\Delta$y are respectively pixel sizes (mm), N is the number of data samples, ts is a data sampling interval ($\mu$s), G is a constant corresponding to an inclined magnetic field strength for MR projection (Hz/cm), C is a constant corresponding to the reconstruction matrix and $\theta$a is a projection angle.

From FIG. 2, Sna which is necessary for the calculation of equation (5) can be obtained as follows:

$$S1a = S0a - \Delta Ya, \qquad (9)$$

$$S2a = S1a - \Delta Ya, \text{ and}$$

$$\cdot \quad \cdot$$
$$\cdot \quad \cdot$$
$$\cdot \quad \cdot$$

-continued $$Sna = S(n-1)a - \Delta Ya.$$

In accordance with attributes of the parallel beam, $0° \leq \theta < 180°$ is satisfied. From this condition and the above equations (7) and (8), the following relations can be obtained:

$$0° \leq \theta a < 90° \rightarrow \Delta Xa \geq 0 \quad (10),$$

$$90° \leq \theta a < 180° \rightarrow \Delta Xa < 0 \quad (11),$$

and $$0° \leq \theta a < 180° \rightarrow \Delta Ya \geq 0 \quad (12).$$

In the XCT system, $\Delta Xa$ is processed so as to satisfy the condition of $\Delta Xa \geq 0$ by the rotation of the coordinate system of the projection data. For this reason, when the XCT system is always operated so as to satisfy the condition $\Delta Xa \geq 0$, calculation of equation (5) by the reconstructor is performed only by positive addition.

The present invention has been made in accordance with the condition of equation (12). In the present invention, coordinate conversion is performed such that the Y-direction, not the X-direction, corresponds to the line direction, as shown in FIG. 2. As a result, processing only by positive addition can be performed as in the following equation. Therefore, the reconstructor of the XCT system can be utilized in the MRI system.

$$S1 = Sna + \Delta Ya, \quad (13)$$

$$S2 = S1 + \Delta Ya, \text{ and}$$

$$\cdot \quad \cdot \quad \cdot$$

$$\cdot \quad \cdot \quad \cdot$$

$$\cdot \quad \cdot \quad \cdot$$

$$Sk = S(k-1) + \Delta Ya.$$

Equation (13) corresponds to equation (5) in the case of the XCT system. Therefore, in this case, the reconstructor calculates equation (13), and back projection processing as in equation (4) is performed in accordance with the calculation result.

Figure 2:
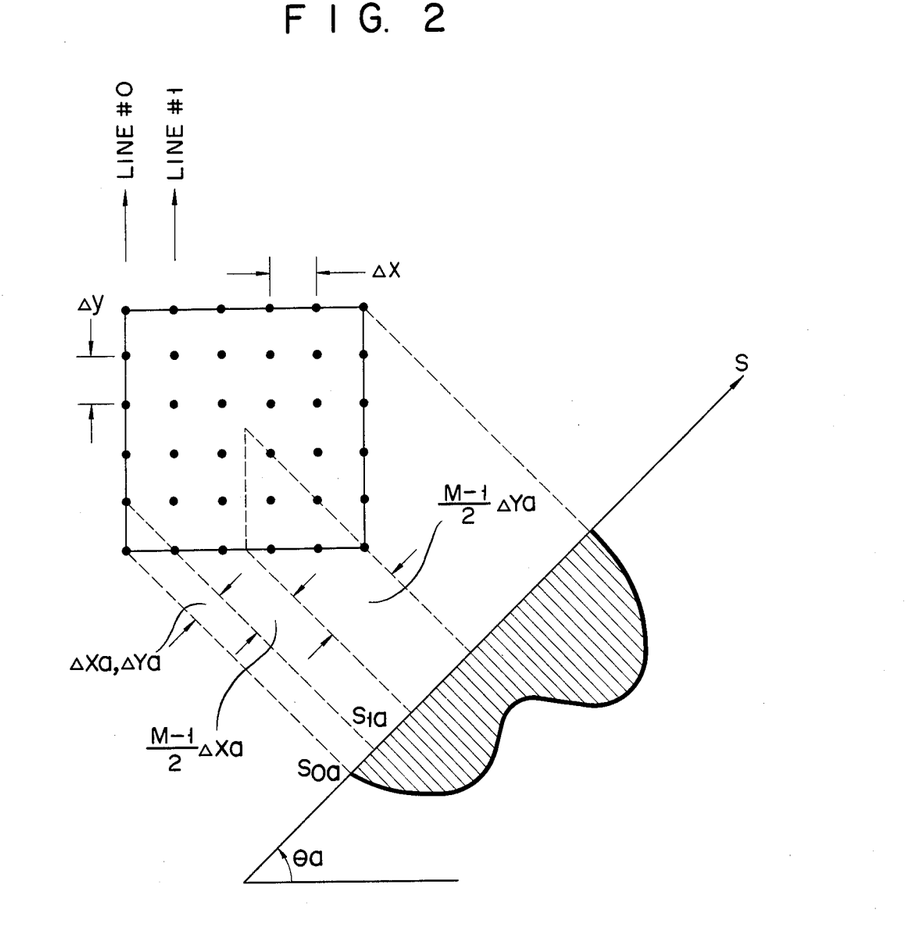
FIG. 2 is a view for explaining a principle of back projection image reconstruction according to an embodiment of the present invention.

From FIG. 2, $\Delta Ya$ is constant in all the lines in the identical projection. In this case, since the projection is performed by the parallel beams, $\Delta Xa$ is also constant in the identical projection. Therefore, the reconstruction starting point $Sna$ can be calculated by the following equations:

$$S1a = S0a + \Delta Xa, \quad (14)$$

$$S2a = S1a + \Delta Xa, \text{ and}$$

$$\cdot \quad \cdot \quad \cdot$$

$$\cdot \quad \cdot \quad \cdot$$

$$\cdot \quad \cdot \quad \cdot$$

$$Sna = S(n-1)a + \Delta Xa.$$

In the constants generating circuit according to the present invention, calculation of equation (14) is made and, when $Sna$, $\Delta Ya$ and $\omega a$ are given to the reconstructor of the FRU in the XCT system, image reconstruction can be performed in a short time.

In the case shown in FIG. 2, $S0a$, which becomes a reference of equation (14), can be obtained by the following equation:

$$S0a = [\{(M-1)/2\}\Delta Ya - \{(M-1)/2\}\Delta Xa] + C \quad (15).$$

Equation (15) can be calculated in advance by the host CPU.

Figure 3:
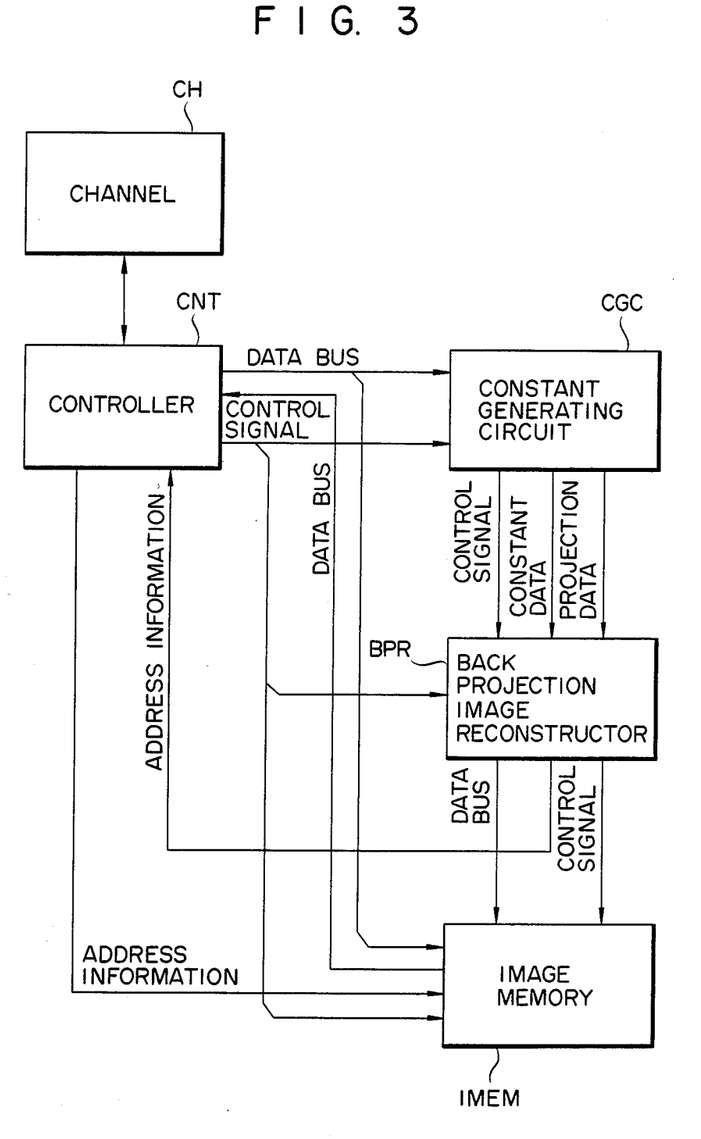
FIG. 3 is a block diagram showing a construction of a main part of an MRI system according to the embodiment of the present invention.

FIG. 3 shows a configuration of the FRU for the MRI system according to the embodiment of the present invention in accordance with this principle.

The FRU for the MRI system comprises a selector channel Ch for coupling to the host CPU; a controller CNT having a control sequencer, a bus driver and the like; a constant generating circuit CGC; a back projection image reconstructor BPR having the same construction as that in the XCT system as described above, and an image memory IMEM having the same construction as that in the XCT system.

In such a construction, when a predetermined command is supplied to the controller CNT from the host CPU of the MRI system, the FRU is sequentially operated, thereby performing reconstruction for one line of an image. Furthermore, the FRU is connected to the host CPU by the channel CH and data transmission between the FRU, and a main memory of the MRI system is performed by a direct memory access (DMA) bus indendently of the CPU. Therefore, a load of the CPU is reduced, thereby improving the system efficiency of the MRI system. The image memory IMEM has another function of adding reconstruction data of respective projections, and the obtained sum is stored therein as image data. The image memory IMEM has a storing area corresponding to respective pixels of the image matrix (stored contents in the storing area corresponding to these respective pixels are reset when the reconstruction processing starts), and the reconstruction data which is back-projected to the respective pixels by the reconstructor BPR is accumulated for every pixels and stored therein. Generally, in the XCT system, the maximum image matrix size is $512 \times 512$. In the MRI system, the maximum image matrix size can also be regarded as $512 \times 512$. For this reason, an image memory for the XCT system can be utilized in the MRI system.

Figure 4:
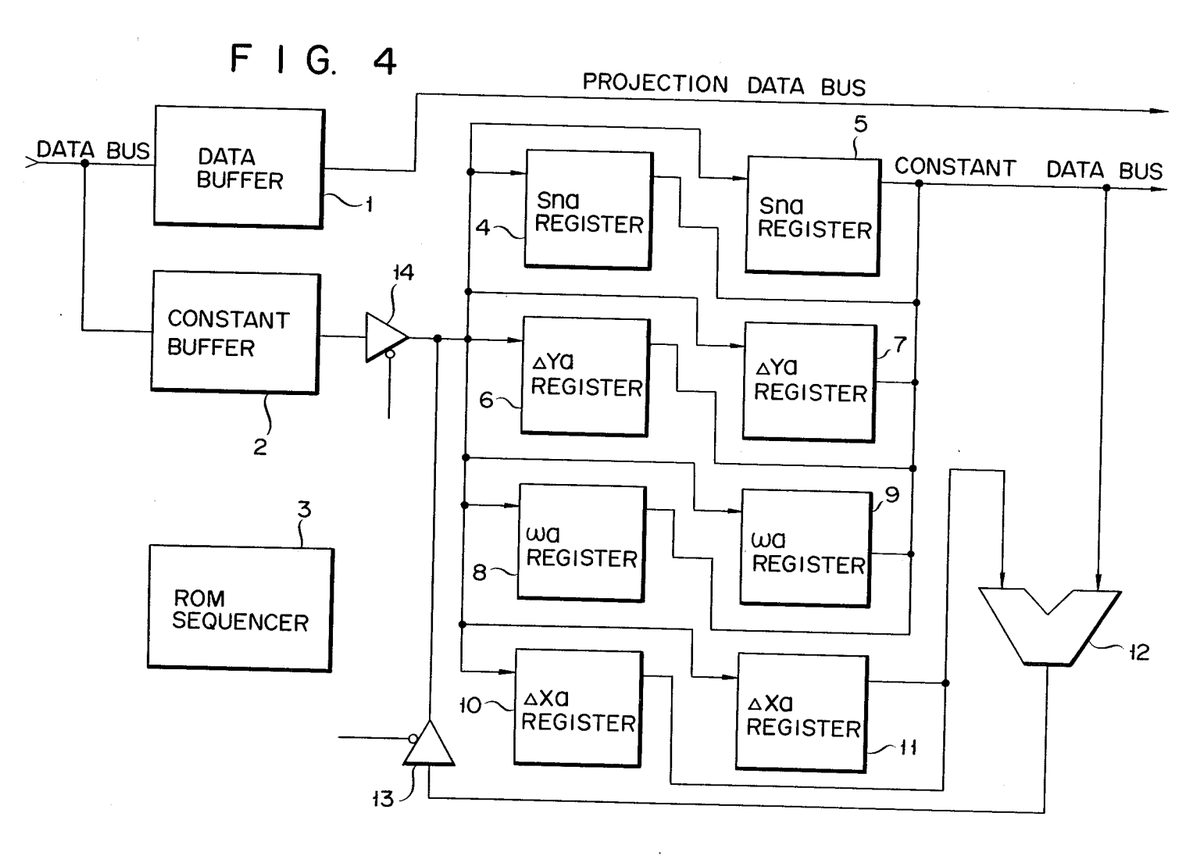
FIG. 4 is a block diagram showing the construction of the main part shown in FIG. 3 in more detail.

FIG. 4 shows the constant generating circuit CGC in more detail.

In FIG. 4, a data buffer 1 is a buffer memory for the projection data. A timing shift between the constant generating circuit CGC and the reconstructor BPR is corrected by this data buffer 1. The data buffer 1 has a memory capacity for at least two projections. A constants buffer 2 is a buffer memory for respective constants. This constant buffer 2 has a capacity for storing data of at least 300 projections. In a read-only memory (ROM) sequencer 3 consisting of a ROM, sequence control information which directly corresponds to control signals for controlling the respective constant output timing is programed as data in the ROM. In this ROM sequencer 3, the sequence control information stored therein is sequentially read out in synchronism with a reference clock (i.e., an address counter is sequentially counted up by the reference clock and the sequence control information is simultaneously read out), thereby generating the control signals in accordance with the respective predetermined output timings. The respective constant output timings are controlled in response to these control signals. Constant registers 4 to 9 are respectively output registers of the constants Sna, ΔYa and ωa. The constant registers 4 and 5 are respectively used as Sna registers, the constant registers 6 and 7 are respectively used as ΔYa registers, and the constant registers 8 and 9 are respectively used as ωa registers. ΔXa registers 10 and 11 are necessary for the adding operation. An adder 12 for accumulation has a bit length of the required bit number +8 bits to perform a maximum of 512 adding operations. Gates 13 and 14 are provided to prevent the outputs of the adder 12 and the constant buffer 2 from being simultaneously supplied to the respective registers 4 to 11. These gates 13 and 14 are controlled by the ROM sequencer 3 and one of the outputs of the adder 12, and the constant buffer 2 is selected in accordance with their operations.

In FIG. 4, the constant registers 4 to 9 are provided such that the constants Sna, ΔYa and ωa are respectively stored in two of the registers 4 to 9. In addition, the capacity of the data buffer 1 enables storage of the back projection data for a maximum of two projections. In such a construction, "duplex of pipe-line processing" can be performed using two reconstructors in parallel. This construction in which duplex of the pipe-line processing can be performed is one of characteristics features of the present invention. When the duplex processing is adopted, the reconstructing operation with respect to the two projections can be performed in parallel. When compared to the case wherein the system comprises only one reconstructor, image reconstruction can be completed in about half the time. For this reason, operation efficiency of the MRI system can be improved.

In this embodiment, as described above, the constant registers 4 and 5 are the Sna registers, the constant registers 6 and 7 are the ΔYa registers, and the constant registers 8 and 9 are the ωa registers. The I/O operation of these registers 4 to 9 is controlled by the ROM sequencer 3.

In the case wherein no duplex processing is adopted, that is, a non-duplex processing is adopted, one of two pairs of the registers 4 to 11, for example, the constant registers 4, 6 and 8 and the ΔXa register 10, is used.

The constants for one frame of an image are transferred to the constant buffer 2 from the host CPU. The projection data is transferred to the data buffer 1 from the host CPU for every projection.

The projection data for one projection is transferred to the reconstructor BPR from the data buffer 1. At substantially the same time, the constants S0a, ΔYa, ωa and ΔXa are respectively transferred to the constant registers 4, 6 and 8 and the ΔXa register 10 from the constants buffer 2. Subsequently, S0a, ΔYa, ωa and ΔXa are respectively generated from these constant registers 4, 6 and 8 and the ΔXa register 10. These outputs S0a, ΔYa, ωa and ΔXa are transferred to the reconstructor BPR and the outputs S0a and ΔXa are respectively supplied to the adder 12. The constants S0a and ΔXa are added to each other by the adder 12. Then, the updated constant S1a is latched by the constant register 4 for holding Sna. The output S1a is generated from the constant register 4 and is supplied to the reconstructor BPR. At the same time, the output S1a and the output ΔXa from the ΔXa register 10 are added to each other by the adder 12. The sum S2a is latched by the constant register 4 for holding Sna. In this manner, the reconstruction starting points Sna of the respective lines can be sequentially calculated without requiring complex calculation, and these sums Sna are sequentially supplied to the reconstructor BPR. In this manner, after transferring the constants for one projection (during the transferring operation of the constants, the projection data for one projection has been transferred to the reconstructor BPR from the data buffer 1), the projection data for next one projection is transferred to the CPU from the data buffer 1. The above processing is repeated for every projection.

The calculation is simplified by sufficiently utilizing the characteristic that the projection in the MRI system is regarded the same as that by the parallel beam.

On the other hand, in the case of duplex operation, all the registers 4 to 11 are used. In addition, two pairs of the reconstructor BPR provided in a later stage of the constant generating circuit are used. In this case, the constant registers 4, 6 and 8 and ΔXa register 10 and the constant registers 5, 7 and 9 and the ΔXa register 11 are used for constant generation, corresponding to the different projections. The processing for the two projections can be performed in parallel during substantially the same period.

The constants for one frame of an image are transferred to the constant buffer 2 from the host CPU. The projection data is transferred by two projections to the data buffer 1 from the host CPU.

The projection data for one projection (i.e., projection number a=p) and the projection data for the other projection (i.e., projection number $a=p+1$) are respectively transferred to first and second portions of the reconstructor BPR. At substantially the same time, S0p, ΔYp, ωp and ΔXp are respectively transferred to the constant registers 4, 6 and 8 and the ΔXa register 10, and the outputs S0p, ΔYp, ωp and ΔXp are respectively generated therefrom. The outputs S0p, ΔYp, ωp and ΔXp are respectively supplied to the first portion of the reconstructor BPR, and the outputs S0p and ΔXp are supplied to the adder 12. These outputs S0p and ΔXp are added to each other, and the updated constant S1p is latched by the constant register 4 for holding the Sna. Then, S0(p+1), ΔY(p+1), ω(p+1) and ΔX(p+1) are respectively transferred to the constant registers 5, 7 and 9 and the ΔXa register 11 from the constant buffer 2, and the outputs S0(p+1), ΔY(p+1), ω(p+1) and ΔX(p+1) are respectively generated therefrom. These outputs S0(p+1), ΔY(p+1), ω(p+1) and ΔX(p+1) are supplied to the second portion of the reconstructor BPR, and the outputs S0(p+1) and ΔX(p+1) are supplied to the adder 12. These outputs S0(p+1) and ΔX(p+1) are added to each other by the adder 12, and the updated constant S1(p+1) is latched by the constant register 5 for holding Sna. Subsequently, S1p is generated from the constant register 4 and is supplied to the first portion of the reconstructor BPR. Simultaneously, the output S1p and the output ΔXp from the ΔXp register 10 are added to each other by the adder 12. The sum S2p is latched by the constant register 4. Then, the output S1(p+1) is transferred to the second portion of the reconstructor BPR from the constant register 5. Simultaneously, the output S1(p+1) and ΔX(p+1) are added to each other by the adder 12. The sum S2(p+1) is latched by the constant register 5. In this manner, the reconstruction starting points Sna of the respective lines for the two projections are sequentially calculated without requiring complex calculation and are sequentially supplied to the reconstructor BPR. After the constants for the two projections are transferred to the first and second part of the reconstructor BPR, respectively, (during the tranferring operation of these constants, the projection data for the two projections has been transferred to the reconstructor BPR from the data buffer 1), the projection data for the next two projections is transferred to the data buffer 1 from the CPU. The above processing is repeated.

Selection between the non-duplex processing mode and the duplex processing mode in the constant generating circuit CGC is performed by switching a read-out address range of the ROM sequencer 3 in correspondence to the state of the switch provided in the controller CNT. In the ROM sequencer 3, sequences corresponding to the non-duplex processing mode and the duplex processing mode are respectively stored in the different storing areas.

Figure 5:
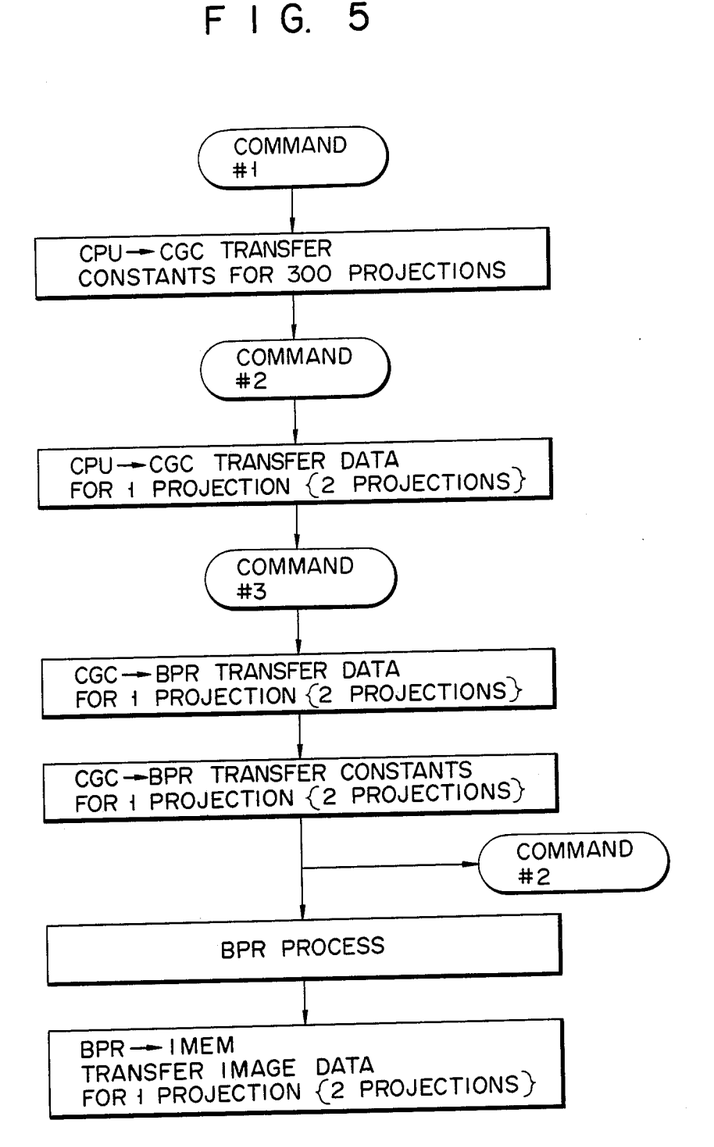
FIG. 5 is a flow chart showing an example of an operation sequence shown in FIG. 3.

FIG. 5 is a flow chart schematically showing a sequence of the processing of the FRU for the MRI system according to this embodiment. In this case, the projection number is 300 and the image matrix is a 512×512 matrix. FIG. 5 and the corresponding description correspond to the non-duplex processing mode. However, each of the descriptions which is inserted between two braces "{"and "}" represents the case of the duplex processing. Note that in FIG. 5, the word "CPU" means not only the host CPU itself, but includes memories.

In FIG. 5, commands 1 to 3 are supplied to the controller of the FRU from the CPU. When the command 1 is supplied to the FRU, the constants for one scanning, that is, for 300 projections are transferred to the CGC from the CPU. When the command 2 is supplied to the FRU, the projection data for one projection {two projections} are transferred to the CGC from the CPU. These commands 1 and 2 enable the back projection processing. The back projection processing for one projection {two projections} is performed by the command 3. When the processing starts in response to to the command 3, the projection data for one projection {two projections} is transferred to the BPR from the CGC, and constants for one projection {two projections} are transferred to the BPR from the CGC. Thereafter, the back projection processing by the BPR for one projection {two projections} is performed. The "back projection processing by the BPR" will be referred to as the BPR processing hereafter. When the image data for one projection obtained by this BPR processing is transferred to the IMEM.from the BPR, the back projection processing for one projection {two projections} by the command 3 is completed. When the transferring operation of the projection data and the constants from the CGC to the BPR for one projection {two projections} is completed, a status flag which represents this completed state is set. When this flag is recognized by the CPU, the command 2 is supplied from the CPU to the FRU, and during the BPR processing for one projection {two projections}, the projection data for next one projection {two projections} is transferred to the constant generating circuit CGC. In this manner, the processing by the commands 2 and 3 is repeatedly performed, thereby eliminating a data transfer time from the CPU to the CGC in the back projection.

In the duplex processing mode, since the processing for two projections are performed at substantially the same time, it can be performed in a half period of time for the normal processing (non-duplex processing).

When duplex of pipe-line processing is adopted, processing efficiency can be considerably improved. This duplex of pipe-line processing can be realized by utlilizing the pipe-line processing according to the present invention.

What is claimed is:

1. A magnetic resonance imaging system in which a magnetic resonance phenomenon is caused in an object to be examined, a magnetic resonance signal which is induced by the magnetic resonance phenomenon is detected, projection data, in which resonance data of specific nucleus is projected on a specific slice of the object to be examined, can be obtained in many directions in accordance with a detection signal, an image reconstruction processing using the projection data is performed, and image data which represents at least one of a spin density of the specific nucleus and a relaxation time constant is obtained, comprising an image reconstruction processing means for performing the image reconstruction processing, said image reconstruction processing means comprising:

a central processing unit for respectively generating data of a reconstruction starting point of projection data about a first line parallel to a second direction in a reconstruction image matrix in which coordinate axes consist of a first direction corresponding to a direction parallel to a projection angle reference direction and the second direction perpendicular to the first direction, and data of a sampling interval and data of a predetermined correction coefficient value of the projection data along the first and second directions for every projection;

a constant generating circuit for sequentially generating respective data of the sampling interval for the second direction and the correction coefficient value for every projection and for generating the reconstruction starting point data of respective lines which are aligned along the first direction and parallel to the second direction in correspondence to the reconstruction starting point of the first line parallel to the second direction, and the sampling intervals for the first and second directions and the correction coefficient value which are provided from said central processing unit;

a reconstructor in which reconstruction sampling positions of the projection data along a line direction parallel to the second direction corresponding to the reconstruction starting points are obtained by adding the sampling intervals to the respective reconstruction starting points in correspondence with the data of the sampling interval for the second direction and the correction coefficient values and reconstruction starting points of the respective lines parallel to the second direction in the reconstruction image matrix which are supplied from said constant generating circuit, thereby performing back projection on the reconstruction image matrix for the sampling positions;

an image memory for accumulating and holding image data which is back-projected by said reconstructor; and a timing controlling unit for generating control signals for determining an operation timing and supplying the same to said constant generating circuit, said reconstructor and said image memory.

2. A magnetic resonance imaging system according to claim 1, wherein said constant generating circuit comprises means for calculating the reconstruction starting points of the respective lines parallel to the second direction, by successively adding the sampling intervals of the first direction to the reconstruction starting point of the first line parallel to the second direction.

3. A magnetic resonance imaging system according to claim 2, wherein said constant generating circuit comprises a constant buffer for temporarily storing the data of the reconstruction starting point for the first line parallel to the second direction for one projection, the sampling intervals for the first and second directions and the correction coefficient value; a reconstruction starting point register, sampling interval registers and a correction coefficient value register for respectively latching the data of the reconstruction starting point, the sampling intervals for the first and second directions and the correction coefficient value; an adder for adding a holding value of said reconstruction starting point register and a holding value of said sampling interval register for the first direction so as to supply a sum to said reconstruction starting point register; and a sequencer for controlling in such a manner that the control signal is supplied to said reconstruction starting point register, said sampling interval registers for the first and second directions and said correction coefficient value register and to said adder the data of the reconstruction starting point for the first line parallel to the second direction, the sampling intervals for the first and second directions and the correction coefficient value are transferred to said reconstruction starting point register, said sampling interval registers for the first and second directions and said correction coefficient value register, the data of the reconstruction starting point for the first line, the sampling interval for the second direction and the correction coefficient value are transferred to said reconstructor from said reconstruction starting point register, said sampling interval register for the second direction and said correction coefficient value register, a holding value of said reconstruction starting point register and a holding value of said sampling interval register for the first direction are sequentially added to each other, a sum is stored in said reconstruction starting point register, stored values of said reconstruction starting point register are sequentially transferred to said reconstructor.

4. A magnetic resonance imaging system according to claim 3, wherein said sequencer is a read-only memory sequencer in which control data is preset in a read-only memory, and the control data is sequentially read out in synchronism with a reference clock by an address counter which is incremented by the reference clock.

5. A magnetic resonance imaging system according to claim 2, wherein two of said reconstructors are provided, and said constant generating circuit comprises a constant buffer for temporarily storing the data of the reconstruction starting point for two projections for the first line parallel to the second direction, and the sampling intervals for the first and second directions and the correction coefficient value; two sets of a reconstruction starting point register, sampling interval registers for the first and second directions and a correction coefficient value register for respectively latching the data of the reconstruction starting point, the sampling intervals for the first and second directions and the correction coefficient value; an adder for adding a holding valve of said reconstruction starting point register and said sampling interval register for the first direction corresponding to said reconstruction starting point register to each other so as to supply a sum to said reconstruction starting point register; and a sequencer for controlling in such a manner that the control signal is supplied to one set of said reconstruction starting point register, said sampling interval registers for the first and second directions and said correction coefficient value register and to said adder, the data of the reconstruction starting point for the first line parallel to the second direction, of the sampling intervals for the first and second directions and of the correction coefficient value is transferred to one set of said reconstruction starting point register, said sampling interval registers for the first and second directions and said correction coefficient value register, the data of the reconstruction starting point for the first line, of the sampling interval for the second direction and of the correction coefficient value is transferred to one of said reconstructors from said one set of said reconstruction starting point register, said sampling interval register for the second direction and said correction coefficient value register, a holding value of said reconstruction starting point register and a holding value of said sampling interval register for the first direction are sequentially added to each other, a sum is stored in a corresponding one of said reconstruction starting point registers, the data for the first line parallel to the second direction for one projection of the reconstruction starting point, the sampling intervals for the first and second directions and the correction coefficient value are respectively transferred to the other set of said reconstruction starting point register, said sampling interval registers for the first and second directions and said correction coefficient value register, the data for the first line of the reconstruction starting point, the sampling interval for the second direction and the correction coefficient value are respectively transferred to the other one of said reconstructors from the other set of said reconstruction starting point register, said sampling interval register for the second direction and said correction coefficient value register, a holding value of said reconstruction starting point register is added to that of said sampling interval register for the first direction and a sum is stored in a corresponding one of said reconstruction starting point registers, and an adding operation of the holding value of said reconstruction starting point register and that of said sampling interval register of the first direction and a storing operation of a sum thereof to the corresponding one of said reconstruction starting point registers are alternately performed by the two sets of said registers.

6. A magnetic resonance imaging system according to claim 5, wherein said sequencer is a read-only memory sequencer in which control data is preset in a read-only memory, and the control data is sequentially read out in synchronism with a reference clock by an address counter which is incremented by the reference clock.

7. A magnetic resonance imaging system according to claim 1, wherein said central processing unit is a host central processing unit.

* * * * *

UNITED STATES PATENT AND TRADEMARK OFFICE
CERTIFICATE OF CORRECTION

PATENT NO. : 4,620,153

DATED : October 28, 1986

INVENTOR(S) : Masaaki Hino

It is certified that error appears in the above-identified patent and that said Letters Patent is hereby corrected as shown below:

On the cover page please change the city in [73] to
-- Kawasaki-shi --

Signed and Sealed this

Thirty-first Day of March, 1987

Attest:

DONALD J. QUIGG

Attesting Officer

Commissioner of Patents and Trademarks